(12) United States Patent
Roizin et al.

(10) Patent No.: US 7,679,119 B2
(45) Date of Patent: Mar. 16, 2010

(54) CMOS INVERTER BASED LOGIC MEMORY

(75) Inventors: Yakov Roizin, Migdal Haemek (IL); Victor Kairys, Migdal Haemek (IL); Erez Sarig, Migdal Haemek (IL); David Zfira, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 164 days.

(21) Appl. No.: 11/936,727

(22) Filed: Nov. 7, 2007

(65) Prior Publication Data

US 2008/0135904 A1    Jun. 12, 2008

Related U.S. Application Data

(60) Provisional application No. 60/869,520, filed on Dec. 11, 2006.

(51) Int. Cl.
*H01L 29/94* (2006.01)
*H01L 27/092* (2006.01)

(52) U.S. Cl. .................. 257/298; 257/288; 257/315; 257/351; 257/E21.209; 257/E27.027; 257/E27.067

(58) Field of Classification Search ................. 257/288, 257/298, 315, 351, E21.209, E27.027, E27.067
See application file for complete search history.

(56) References Cited

U.S. PATENT DOCUMENTS

| | | | |
|---|---|---|---|
| 5,272,368 A * | 12/1993 | Turner et al. | 365/185.1 |
| 5,619,942 A | 4/1997 | Stewart et al. | |
| 5,912,509 A | 6/1999 | Kasai et al. | |
| 6,146,939 A | 11/2000 | Dasgupta | |
| 6,483,139 B1 | 11/2002 | Arimoto et al. | |
| 6,489,650 B2 | 12/2002 | Kumazaki | |
| 6,788,576 B2 * | 9/2004 | Roizin | 365/185.1 |
| 6,818,943 B2 | 11/2004 | Kumazaki | |
| 6,842,327 B1 * | 1/2005 | Diorio et al. | 361/301.4 |
| 2006/0033141 A1 | 2/2006 | Okazaki et al. | |
| 2007/0166912 A1 | 7/2007 | Fenigstein et al. | |
| 2007/0279987 A1 | 12/2007 | Fang et al. | |

OTHER PUBLICATIONS

Buchanan: "Scaling the gate dielectric: Materials, Integration and Reliability", IBM J. Res. Develop. vol. 43, No. 3, May 1999, pp. 245-264.

(Continued)

*Primary Examiner*—Ngan Ngo
*Assistant Examiner*—Benjamin Tzu-Hung Liu
(74) *Attorney, Agent, or Firm*—Bever, Hoffman & Harms, LLP; Patrick T. Bever

(57) ABSTRACT

A single-poly electrically erasable/programmable CMOS logic memory cell for mobile applications includes a CMOS inverter that share a single polysilicon floating gate, and an enhanced control capacitor including a control gate capacitor and an optional isolated P-well (IPW) capacitor formed below the control gate capacitor. The control gate capacitor includes a polysilicon control gate that is interdigitated with the floating gate and serves as a capacitor plate to induce Fowler-Nordheim (F-N) injection or Band-to-Band Tunneling (BBT) to both program and erase the floating gate. The IPW capacitor is provided in the otherwise unused space below the control gate capacitor by a IPW that is separated from the control/floating gates by a dielectric layer and is electrically connected to the control gate. Both F-N injection and BBT program/erase are performed at 5V or less.

15 Claims, 4 Drawing Sheets

OTHER PUBLICATIONS

Chang et al. "A Low Voltage, Low Power P-Channel EEPROM Cell for Embedded and System-On-A-Chip Applications", pp. 1-4.

Kwok "An Innovative NVM Technology for Sub-0.25μm SOC Applications", Programmable Microelectronics Corp. (PMC) Flash, CASPA/CIE System-on-Chip (SOC) Symposium, May 16, 1998, pp. 1-24.

Lee et al. "High-Performance EEPROM's Using N- and P-Channel Polysilicon Thin-Film Transistors with Electron Cyclotron Resonance $N_2O$-Plasma Oxide", IEEE Electron Device Letters, vol. 20, No. 1, Jan. 1999, pp. 15-17.

\* cited by examiner

CMOS INVERTER BASED LOGIC MEMORY

RELATED APPLICATION

This application claims priority of U.S. Provisional Patent Application 60/869,520, entitled "A CMOS Inverter Based Logic Memory" filed Dec. 11, 2006.

FIELD OF THE INVENTION

This invention relates to complimentary metal-oxide-silicon (CMOS) integrated circuit (IC) devices, and more particularly to memories for passive radio frequency identification (RFID) CMOS IC devices and other mobile applications.

BACKGROUND OF THE INVENTION

Mobile devices are typically hand-held devices that usually include a limited battery power source and a non-volatile memory for storing data when the mobile device is powered down. The power consumption needed to program/erase such non-volatile memory is a significant factor in how long a mobile device is able to operate on a given battery charge.

A radio frequency identification (RFID) system represents one type of mobile device that identifies unique items using an interrogator and an RFID device (sometimes referred to as a "tag"). Typically, the interrogator communicates with the RFID device that is attached to an item. The interrogator, also known as a reader, communicates with the RFID device through radio frequency signals, and passes the information read from the RFID device in digital form to a computer system. The RFID device is typically a microchip that stores the digital information using non-volatile memory cells. The microchip is attached to an antenna for communication with the interrogator. The RFID device includes a unique serial number and may include other information, such as a customer account number.

RFID devices can be active, passive, or semi-passive. Active RFID devices include a power source that powers the microchip's circuitry and transmits a signal to the interrogator. Passive RFID devices do not include a power source, and draw all the power required for the circuitry and the transmission of information from the radio frequency electromagnetic field generated by the interrogator. Semi-passive tags are similar to active tags, but their power source is only used to run the microchip's circuitry, not to communicate with the interrogator.

All power supplied to passive RFID devices is provided by the RF signal transmitted from the interrogator, and therefore must exhibit low power consumption of the embedded non-volatile memory in all operational states: programming, erasing, and readout. The currents utilized to facilitate the operational states of the non-volatile memory should typically not exceed 100 nA per cell (especially during flash erase operations), while the program/erase times must relatively short (less than several milliseconds). An additional requirement is that read-out operations must be performed at low voltages (i.e., at the level of 1V or below), because otherwise power-consuming additional charge pumps must be included in the RFID chip design. Moreover, the passive RFID device must be inexpensive to manufacture (i.e., not requiring additional masks or process steps in addition to the core CMOS process flow).

There are several conventional RFID device memory cell types.

A first type of RFID memory cell type uses the CMOS inverter principle for readout and is programmed by band-to-band tunneling (BBT) of electrons and erased by BBT holes. This first RFID memory cell type is disclosed, for example, in U.S. Pat. No. 6,788,576 (Complementary non-volatile memory cell; Yakov Roizin, 2004), which is incorporated herein by reference in its entirety. An advantage of this cell is that it requires very low read-out currents due to utilization of the CMOS inverter read-out principle. In addition, much lower program-erase currents (of the order of 300-500 nA, programming time approximately 100 μs, erase time approximately 20 ms) compared with memories employing channel-hot-electron (CHE) for programming. CHE programming requires at least tens of microAmps (see, e.g., U.S. Pat. No. 5,619,942, Stewart et al., 1997)). Another advantage of BBT electron and hole injection mechanisms is their efficiency. In particular, one can strongly decrease the transfer point Vm of the FG CMOS inverter. A strongly negative Vm can be achieved using the voltages of the core CMOS circuit (below 5V), thus allowing sufficient erase margins with low Vread voltages.

Despite the mentioned advantages, the currents used in pure BBT programming/erasing single polycrystalline silicon memory devices are higher than required in modern passive RFID devices.

A solution that also employs a CMOS floating gate (FG) inverter, but uses Fowler-Nordheim (F-N) injection mechanism for charging and discharging the FG is disclosed in U.S. Pat. No. 5,272,368 (Turner, 1993). In the disclosed embodiments, special capacitors in the substrate are used: one is a tunneling capacitor through which the FG is charged and discharged, the second capacitor is a control capacitor. There are several limitations in the solution taught by Turner. First, it is difficult to erase a charge on the floating gate to negative values with small voltages (i.e., to extract electrons from the floating gate, or inject holes) because the value of the F-N current is exponentially dependent on the electric field in the tunnel oxide. The current significantly decreases during the erase operation. Attempts to use very high voltages (fields in the gate oxide exceeding 15 MV/cm) result in reliability limitations. Tunneling oxide charge-to-breakdown (Qbd) strongly decreases with the increase of the electrical field, thus limiting the device's endurance (i.e., the effective number of program/erase cycles; see, e.g., D. A. Buchanan "Scaling of gate dielectrics: Materials, Integration and Reliability, IBM Journal of R&D, v. 43, 1999, pp. 245-264). Also, special implants (diffusions) are disclosed in U.S. Pat. No. 5,272,368 to fabricate tunnel and control capacitors. These implants require additional masking steps if implemented in standard CMOS process flows. Moreover, when high voltages are employed for programming and erase (programming with plus 12V at control capacitor, tunnel capacitor terminal grounded, erase with 12V at tunnel capacitor, control capacitor terminal grounded, excess currents (usually of "gate induced drain leakage" (GIDL) origin) flow in the peripheral circuits.

What is needed is a non-volatile (floating gate) memory cell for mobile devices that avoids the problems associated with the prior art structures discussed above. In particular, what is needed is an electrically erasable/programmable CMOS logic memory cell and associated programming/erasing algorithm that functions at low voltage (i.e., below 5V).

SUMMARY OF THE INVENTION

The present invention is directed to an electrically erasable/programmable CMOS logic memory cell for RFID applications and other mobile devices that includes a floating gate (FG) CMOS inverter supplied with an enhanced capacitor arrangement that are used to facilitate band-to-band (BBT) tunneling and/or Fowler-Nordheim injection to program/erase the floating gate such that the absolute voltages applied across the transistors of the inverter remain below 5V. By minimizing the effective program/erase voltages, the present invention both reduces manufacturing costs and increases manufacturing yields by avoiding the need for program/erase transistors having special (i.e., thick) gate oxides, which allows fabrication of CMOS IC devices using existing CMOS process flows.

In accordance with an embodiment of the present invention, each non-volatile logic cell includes a polycrystalline silicon floating gate disposed over the substrate, a control gate capacitor formed by a first portion of the floating gate and a polycrystalline silicon control gate structure that is located adjacent to and capacitively coupled to the floating gate, an optional isolated P-well capacitor formed by an IPW region disposed in the otherwise unused area below the control gate and the first portion of the floating gate, and a non-volatile p-channel transistor controlled by a second portion of the floating gate. The isolated P-well region is electrically connected to the control gate such that a voltage supplied to the control gate is also applied to the isolated P-well region, whereby the control gate capacitor and the IPW capacitor are connected in parallel to facilitate program/erase using only positive and negative voltages at the level of +5V/−5V (or below), thereby limiting the voltage across the various transistors forming the inverter portion of the cell.

In another specific embodiment, the control gate and floating gate are formed by etching a single polysilicon layer such that the control gate and floating gate include "hand" shaped structures having interdigitated fingers, whereby capacitive coupling between the control gate and the floating gate is significantly increased.

In another specific embodiment, an additional p-channel transistor is added into the N-well of the inverter circuit to isolate the non-volatile p-channel transistor from the non-volatile n-channel transistor during program/erase operations.

In another specific embodiment embodiment, a single capacitor is formed by the control gate (i.e., no IPW region is formed below the control/floating gates), and high program/erase potentials are applied to the floating gate using the control gate and the N-well region of the inverter (which is isolated from the adjacent P-well by the additional p-channel transistor mentioned above).

Each of the specific embodiments described above facilitates program/erase operations using voltages of 5V or less, thereby reducing power consumption to lengthen battery life in mobile devices, and also facilitating the production of CMOS IC devices including the non-volatile logic cells of the present invention without requiring costly and time consuming changes to a standard CMOS production flow.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in non-volatile memory cells. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. The terms "coupled" and "connected", which are utilized herein, are defined as follows. The term "connected" is used to describe a direct connection between two circuit elements or nodes, for example, by way of a metal line that are formed in accordance with normal integrated circuit fabrication techniques. In contrast, the term "coupled" (without the modifier "capacitively") is used to describe either direct or indirect connection between two circuit elements or nodes. For example, two coupled elements may be directly connected by way of a metal line, or indirectly connected by way of an electromagnetic or intervening circuit element (e.g., a capacitor, resistor, inductor, or by way of the source/drain terminals of a transistor). The phrase "capacitively coupled" is used herein to describe the intentional placement of two circuit structures (e.g., the plates of a capacitor) such that a significant transfer of the voltage applied to the first circuit structure to the second circuit structure is facilitated by means of the capacitance between the two circuit structures. The term "polysilicon floating gate" is used herein to describe a polysilicon structure that is entirely isolated from signal-carrying conductive structures (i.e., is entirely surrounded by electrically insulating (dielectric) material). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
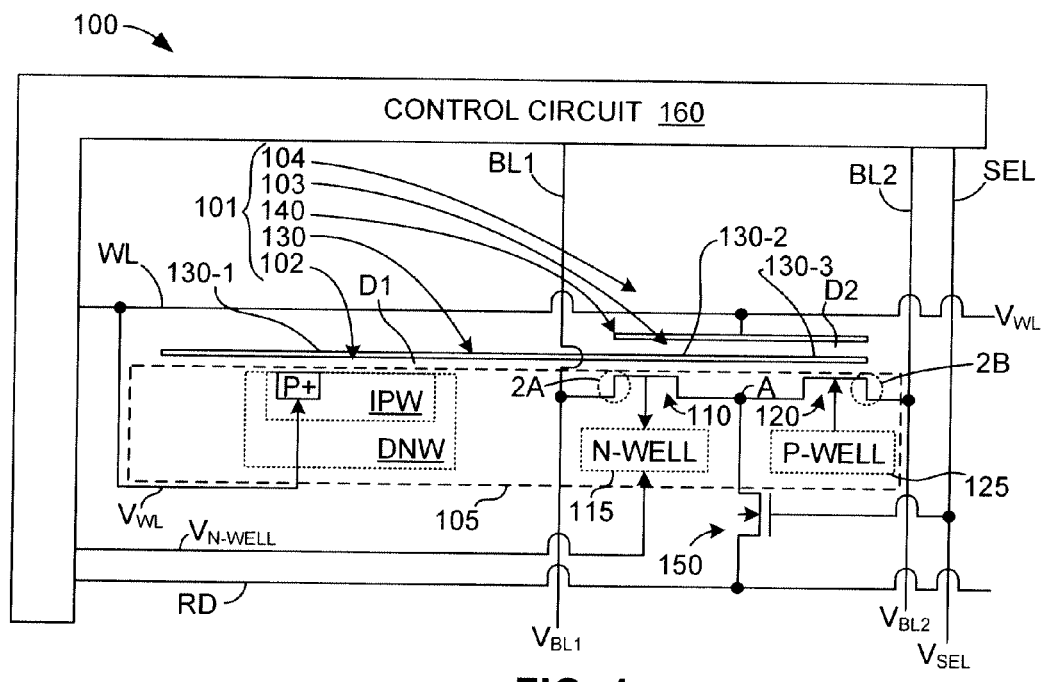
FIG. 1 is a modified schematic view showing a CMOS IC device including an electrically erasable and programmable CMOS logic memory cell according to an embodiment of the present invention.

FIG. 1 is a modified schematic diagram showing a portion of an integrated circuit (IC) 100 including an electrically erasable and programmable CMOS logic memory cell 101 according to a first embodiment of the present invention. CMOS logic memory cell 101 includes a first capacitor 102, a second capacitor 103 and a CMOS complementary non-volatile memory (CNVM) inverter 104 that are fabricated in a common semiconductor (e.g., silicon) substrate 105 such that they share a single polycrystalline silicon (polysilicon) floating gate 130. The operation of CMOS logic memory cell 101 is controlled in the manner described below by way of signals generated by a control circuit 160, which is shown in generalized block form and described functionally herein.

Portions of control circuit 160 are formed in substrate 105 and connected/coupled to logic memory cell 101 according to known fabrication techniques, and a suitable circuit configuration for implementing control circuit 160 is understood by those skilled in the art.

In accordance with an aspect of the present invention, capacitor 102 includes an isolated P-well region IPW formed in substrate 105, a corresponding (first) portion 130-1 of floating gate 130, and a dielectric region D1 disposed therebetween. Isolated region IPW is formed in a first deep N-well region DNW that is disposed below first region 130-1 of floating gate 130, with dielectric region D1 disposed between first region 130-1 and isolated region IPW (and deep N-well region DNW). Isolated P-well region IPW and deep N-well region DNW are formed using known techniques (e.g., by way of a standardized 0.18 μm CMOS fabrication flow including a deep N-well fabrication step). The voltage potential across capacitor 102 is controlled by word line signal $V_{WL}$, which is generated on word line WL and also applied to control gate 140 by control circuit 160 in the manner described below. In the present embodiment, isolated P-well region IPW includes a P+ implantation in order to eliminate substrate depletion effects.

Capacitor 102 is formed according to known techniques by controlling the thickness of the high voltage dielectric (e.g., shallow trench isolation (STI) or bottom oxide (BOX) layer) region D1, typically in the range of approximately 70-100 angstroms in the present embodiment, between the polysilicon of floating gate portion 130-1 and isolation region IPW. In one embodiment, isolation region IPW has an area of approximately 20 micrometers square. In a particularly preferred embodiment, isolation region IPW is doped using a suitable ion implantation process to achieve an impurity concentration of approximately $5*10^{17}$ $1/cm^3$.

Similar to the structure described in co-owned U.S. Pat. No 6,788,576, capacitor 103 is formed by the capacitive coupling between control gate 140 and floating gate 130. In one embodiment described in additional detail below, both floating gate 130 and control gate 140 are formed from a single polysilicon (i.e., a "single poly") layer disposed on a dielectric (e.g., STI) layer, and are etched to form an interdigitated structure such that capacitor 103 is formed between vertical side walls of the opposing control/floating gate structures. A dielectric D2 is disposed in the space between control gate 140 and floating gate 130, which in one embodiment comprises silicon nitride (i.e., due to spacer formation and pad dielectric formation under BPSG structures). As indicated in FIG. 1, the control gate structure is connected to isolated P-well region IPW such that "first" capacitor 102 and "second" capacitor 103 are connected in parallel, and collectively form a "control" capacitor that is used in the manner described below to program/erase floating gate structure 130.

Inverter 104 includes both a p-channel non-volatile memory (NVM) transistor 110 and an n-channel NVM transistor 120 that utilize a second region of floating gate structure 130 including a second portion 130-2 and a third portion 130-3. In particular, p-channel transistor 110 includes source and drain regions (terminals) that are separated by a channel region and formed in an n-type well (N-WELL) 115, and third portion 130-2 of shared floating gate structure 130 extending over the channel region between the source and drain regions and separated by a suitable (thin) gate oxide. Similarly, n-channel transistor 120 includes source and drain regions that are formed in a p-type well (P-WELL) 125 and separated by a channel region, and a third portion 130-3 of shared floating gate structure 130 extending over the channel region between the source and drain regions and separated by a suitable (thin) gate oxide. The drains of p-channel transistor 110 and n-channel transistor 120 are connected together at a node A, which in turn is connected to one terminal of a select transistor 150.

Inverter 104 is connected into an associated array by several control lines that are shared by associated cells (not shown) and are controlled by a control circuit 160 of IC 100. Specifically, the source terminal of p-channel transistor 110 is connected to a first bit line BL1, which is controlled by control circuit 160 to carry a first bit line control signal $V_{BL1}$. Similarly, the source of n-channel transistor 120 is connected to a second bit line BL2, which is controlled by control circuit 160 to carry second bit line control signal $V_{BL2}$. Select transistor 150 is a "normal" (i.e., volatile) n-channel FET connected between node A and a read bit line (RD), and has a gate terminal connected to a select line (SEL), which is controlled by control circuit 160 to carry a row select signal $V_{SEL}$. Control circuit 160 also generates a bias voltage signal $V_{N-WELL}$ that is applied to n-well 115, and is typically transmitted to the n-well regions associated with an entire column of CNVM cells, not to each cell individually. P-well region 125 is coupled to the substrate. Control signal $V_{WL}$, which is mentioned above, is generated by control circuit 160 on word line WL and transmitted both to control gate 140 and to isolated region IPW.

Figure 2A:
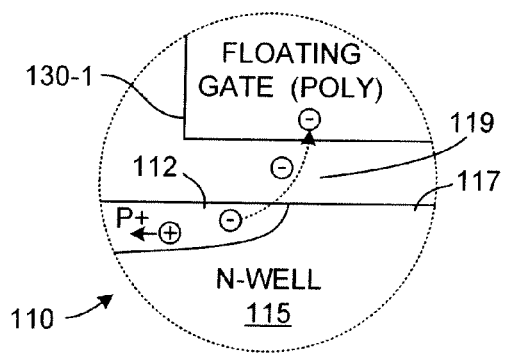
FIGS. 2(A) and 2(B) are partial cut-away views illustrating a programming operation and an erase operation of the memory cell of FIG. 1.
Figure 2B:
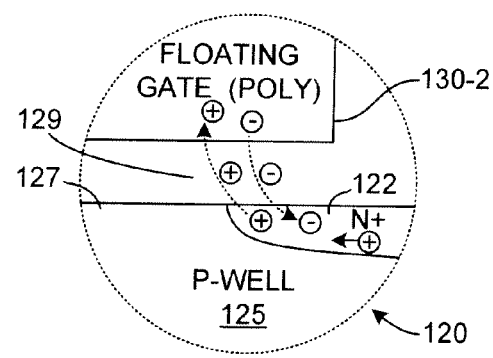

Inverter 104 is fabricated and functions in a manner similar to that described in co-owned U.S. Pat. No. 6,788,576, which is incorporated herein by reference in its entirety. During program operations, a negative voltage (i.e., less than 0 Volts) is applied to the (P+) source region of p-channel transistor 110, and a positive voltage (i.e., greater than 0 Volts) is applied to the control capacitor 102/103 (i.e., to control gate 140 and isolation region IPW), the source of n-channel transistor 120 and the drains of p-channel transistor 110 and n-channel transistor 120 are floating, and n-well region 115 is grounded (i.e., maintained at 0 Volts). As indicated in FIG. 2(A), under these voltage conditions electron-hole pairs are generated in the source region 112 of p-channel transistor 110. The electrons are accelerated by a lateral electric field toward the channel region 117 of p-channel transistor 110, and some of these electrons attain high energy. These high-energy electrons pass through tunnel (bottom) oxide 119 separating source region 112 and floating gate portion 130-2, and become trapped in floating gate structure 130. Similarly, during erase operations, a positive voltage is applied to the (N+) source region 122 of n-channel transistor 120, and a negative voltage is applied to the control capacitor 102/103 (i.e., to control gate 140 and isolation region IPW), the source of p-channel transistor 110, the drains of p-channel transistor 110 and n-channel transistor 120, and n-well region 115 are floating). As indicated in FIG. 2(B), under these voltage conditions, electron-hole pairs are generated in source region 122 of n-channel transistor 120 such that the holes are accelerated by a lateral electric field toward the channel region 127, and causing the injection of BBT holes into floating gate portion 130-3 (or the back-tunneling of electrons from floating gate portion 130-3 to source region 122) through lower oxide 129.

Similar to the cell described in co-owned U.S. Pat. No. 6,788,576, CNVM cell 101 facilitates both low power BBT program and erase operations (traditional p-channel NVM cells that utilize BBT program/erase either require another high-power (e.g., Fowler-Nordheim) erase method or another program method (e.g., CHE). That is, CNVM cell 101 provides a structure in which both p-channel transistor 110 and n-channel transistor 120 share a single floating gate (i.e., floating gate structure 130), thereby facilitating both BBT programming of the floating gate (i.e., through p-channel transistor 110) and BBT erasing of the floating gate (through n-channel transistor 120). Because BBT injection, which is a relatively low voltage process, is used for both program and erase, there is no need for additional gate oxide compared with that used in the standard CMOS process. Accordingly, the use of CNVM cell 101 for embedded non-volatile memory in a CMOS device is beneficial because CNVM cell 101 can be fabricated using the same "standard" CMOS process used to fabricate the "normal" FETs of the CMOS device (i.e., the additional mask and oxide deposition steps needed to form conventional embedded NVM cells are avoided).

According to an aspect of the present invention, CNVM cell 101 is distinguished over the cell described in co-owned U.S. Pat. No. 6,788,576 in that capacitor 102 eliminates the parasitic capacitance to the ground under floating gate 130, thus increasing the capacitance applied by control capacitor 102/103 to floating gate 130 during program/erase operations. As a result, the gate control capacitor coupling ratio is increased in the range of approximately 25-30% over the cell described in co-owned U.S. Pat. No. 6,788,576, which has the benefit of reducing the barriers for injection of hot electrons or holes, thus reducing the program/erase voltages applied to the sources of CMOS transistors 110 and 120 during programming and erase operations, thereby greatly decreasing leakages through the corresponding junctions and avoiding the need of high-voltage devices (like in the control circuit 160). The reduced program/erase voltages provides a further benefit by greatly reducing leakage currents in "peripheral" circuits—such lower leakage currents in the peripheral circuits can create design bottlenecks, especially in the not very large memory arrays.

Figure 3:
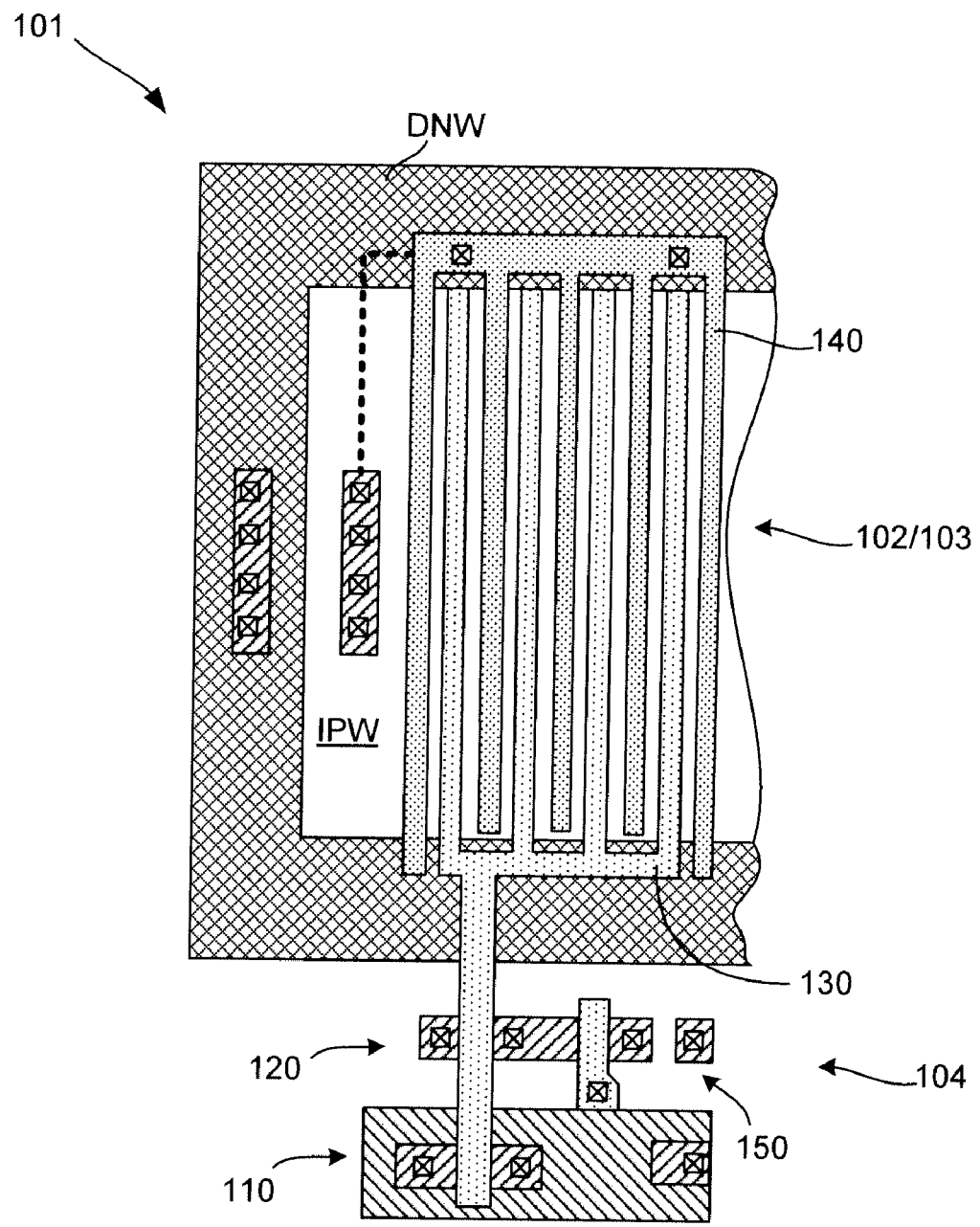
FIG. 3 is simplified top view showing the CMOS logic memory cell of FIG. 1 according to a specific embodiment of the present invention.

FIG. 3 is a simplified layout diagram showing cell 101 including "control" capacitor 102/103 and inverter 104 according to a specific embodiment of the present invention. A single polysilicon layer is formed on a shallow trench isolation (STI) oxide layer over deep N-well region DNW and isolated P-well region IPW, and is then etched using standard CMOS processing to form both floating gate 130 and control gate 140 to include multiple straight fingers extending from common bases such that the fingers of control gate 140 extend parallel to and are interdigitated with (disposed between) corresponding fingers of floating gate 130. The space between the fingers is automatically filled with silicon nitride (i.e., during spacer formation and by the pad dielectric subsequently formed under BPSG structures), thus forming the structure for control gate capacitor 103. IPW capacitor 102 is formed between isolated P-well region IPW and floating gate 130. Contacts to control gate 140 are indicated by the squares along the top horizontal bar. Contacts to IPW are shown in the active region and extend through the STI (dielectric) layer, and are connected to control gate 140 by way of metallization layers, e.g., as indicated by the dashed lines in FIG. 3. The lower portion of floating gate 130 extends over p-channel transistor 110 and n-channel transistor 120, which in turn is connected to select transistor 150.

Figure 4:
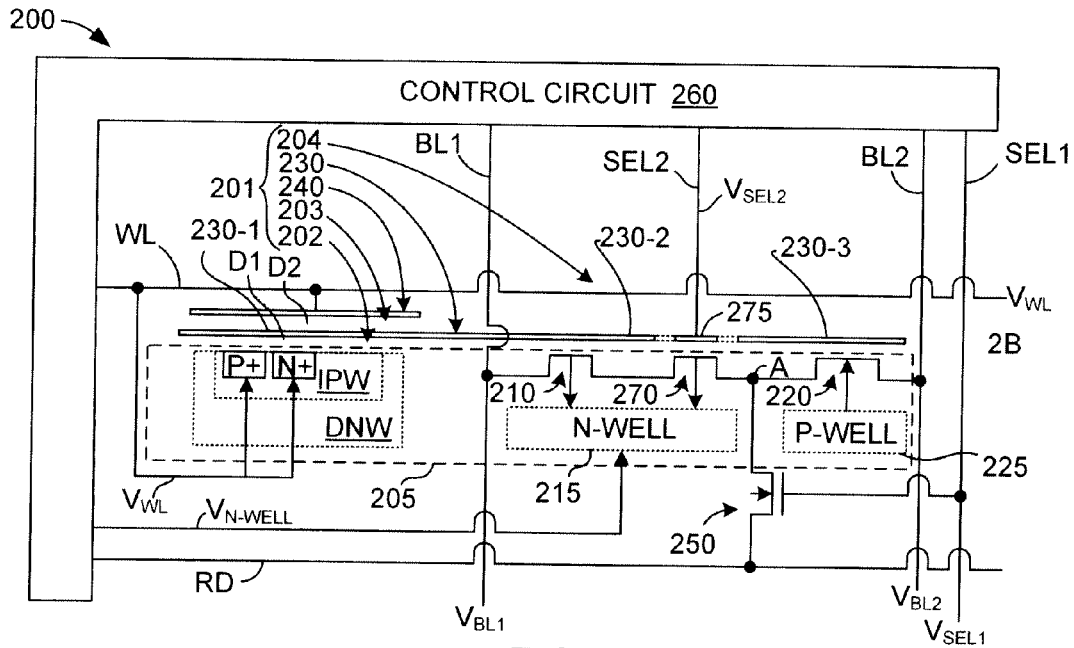
FIG. 4 is a modified schematic view showing a CMOS IC device including an electrically erasable and programmable CMOS logic memory cell according to another embodiment of the present invention.

FIG. 4 is a modified schematic diagram showing a portion of an integrated circuit (IC) 200 including an electrically erasable and programmable CMOS logic memory cell 201 according to another embodiment of the present invention. Similar to CMOS logic cell 101 (described above), CMOS logic memory cell 201 includes a control capacitor including an IPW capacitor 202 and a control gate capacitor 203, and a CMOS complementary non-volatile memory (CNVM) inverter 204 that are fabricated in a common substrate 205, and share a single polysilicon floating gate 230, and is controlled in the manner described below by way of signals generated by a control circuit 260. However, as described below, CMOS logic memory cell 201 differs from CMOS logic cell 101 and is further distinguished over the cell described in co-owned U.S. Pat. No. 6,788,576 in that cell 201 includes IPW capacitor 202 fabricated to support both positive and negative voltage potentials, and inverter 204 includes a second PMOS transistor 170 in order to facilitate Fowler-Nordheim tunneling to further decrease of the erase current, but using voltages that do not exceed 5V absolute value. Referring to the left side of FIG. 4, similar to cell 101, first (IPW) capacitor 202 is formed by isolated P-well region IPW formed in substrate 205, a corresponding (first) portion 230-1 of floating gate 230 located above region IPW, and a dielectric (e.g., shallow trench isolation (STI)) region D1 disposed therebetween. Isolated P-well region IPW and deep N-well region DNW are formed in the manner described above with reference to CMOS logic cell 101. The voltage potential across capacitor 202 is controlled by word line signal $V_{WL}$, which is generated on word line WL and also applied to control gate 240 by control circuit 260 in the manner described below. In the present embodiment, isolated P-well region IPW includes both a P+ implantation and an N+ implantation connected by a butted salicide (i.e., a salicide structure that bridges the P+ and N+ diffusions) in order to eliminate substrate depletion effects (i.e., to keep capacitances high for both positive and negative polarities used during FN program/erase operations, as described below). Capacitor 202 is formed in the manner described above with reference to CMOS logic cell 101.

Similar to capacitor 103, control gate capacitor 203 is formed by the capacitive coupling between control gate 240 and first portion 230-1 of floating gate 230. Floating gate 230 and control gate 240 are formed from a single polysilicon layer disposed on dielectric (e.g., STI) layer D1 over isolated P-well region IPW, and are etched to form an interdigitated structure separated by a dielectric D2 (e.g., silicon dioxide) such that capacitor 203 is formed between vertical side walls of the opposing control/floating gate structures. As indicated in FIG. 3, control gate 240 is connected to isolated region IPW such that capacitors 202 and 203 are connected in parallel, collectively forming a "control" capacitor.

Figure 5:
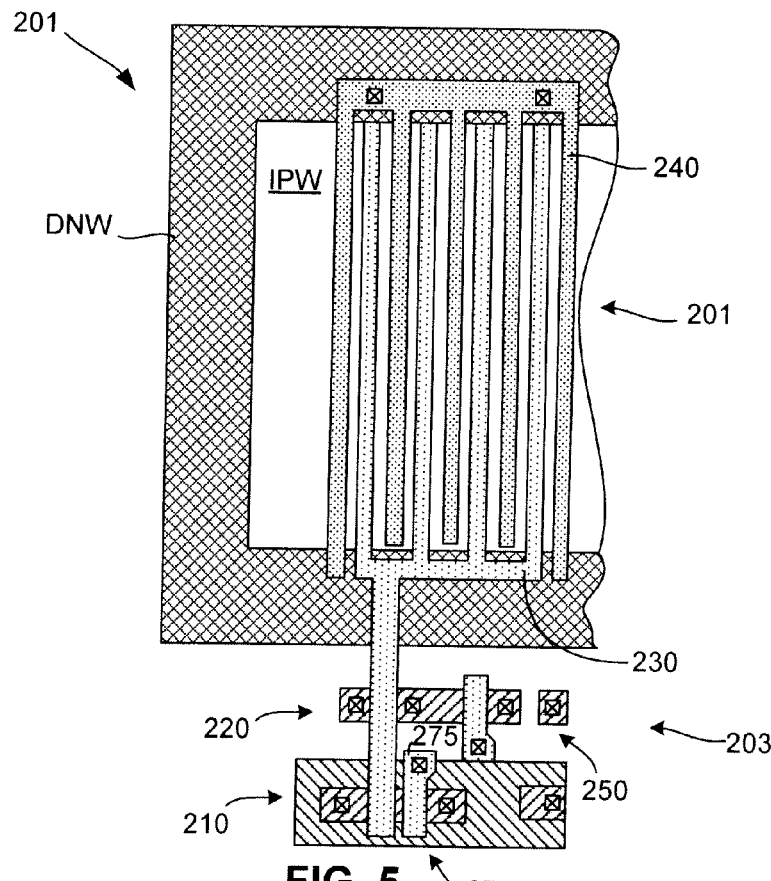
FIG. 5 is simplified top view showing the CMOS logic memory cell of FIG. 4 according to a specific embodiment of the present invention.
Figure 6:
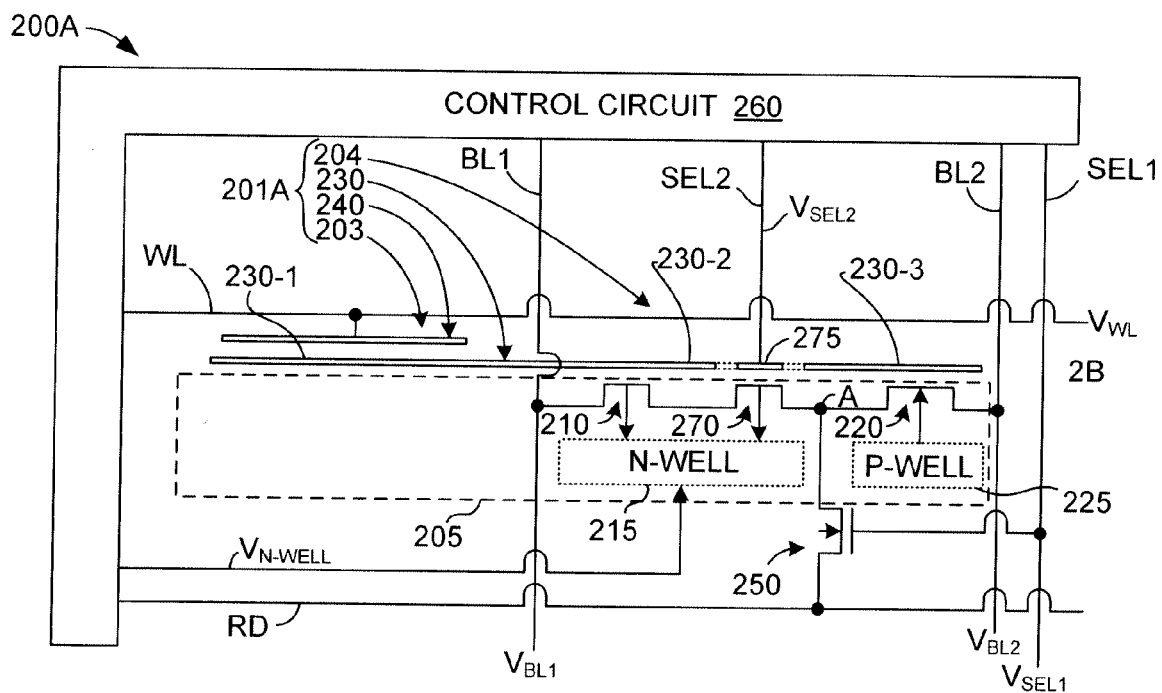
FIG. 6 is a modified schematic view showing a CMOS IC device including an electrically erasable and programmable CMOS logic memory cell according to another embodiment of the present invention.

During program/erase operations, the larger the capacitance of control capacitor 202/203, the closer the potential of floating gate 230 becomes to the potential generated by control capacitor 202/203. As indicated in FIG. 5, in one embodiment the size (capacitance) of control gate capacitor 203 is maximized by utilizing the interdigitated polysilicon arrangement described above with reference to logic cell 101.

Similar to inverter 104 of CMOS logic cell 101, inverter 204 includes both a p-channel non-volatile memory (NVM) transistor 210 and an n-channel NVM transistor 220 that respectively utilize a second portion 230-2 and a third portion 230-3 of floating gate structure 230. P-channel transistor 210 includes source and drain regions (terminals) that are separated by a channel region and formed in an n-type well (N-WELL) 215, and third portion 230-2 of shared floating gate structure 230 extending over the channel region between the source and drain regions and separated by a suitable (thin) gate oxide. Similarly, n-channel transistor 220 includes source and drain regions that are formed in a p-type well (P-WELL) 225 and separated by a channel region, and a third portion 230-3 of shared floating gate structure 230 extending over the channel region between the source and drain regions and separated by a suitable (thin) gate oxide.

Inverter 204 differs from inverter 104 of CMOS logic cell 101 in that an PMOS transistor 270 is formed in N-well 215 between p-channel NVM transistor 210 and node A (described above). PMOS transistor 270 serves to isolate P-well region 225 from N-well region 215 during the erase operation in the manner described below.

Inverter 204 is connected into an associated array by several lines that are controlled by a control circuit 260 in a manner similar to that described above with reference to CMOS logic cell 101. In particular, bit lines BL1 and BL2 carrying control signals $V_{BL1}$ and $V_{BL2}$, select line SEL1 carrying row select signal $V_{SEL1}$, bias voltage signal $V_{N\text{-}WELL}$, and control signal $V_{WL}$, which is transmitted on word line WL and transmitted both to control gate 240 and to isolated region IPW. In addition, a second select line SEL2 is provided to control PMOS transistor 270 by way of polysilicon gate structure 275 (which is also shown in FIG. 5).

Inverter 204 is fabricated and functions in a manner similar to that described in co-owned U.S. Pat. No. 6,788,576, cited above. During program operations, a negative voltage (i.e., less than −3 Volts) is applied to the (P+) source region of p-channel transistor 210, and a positive voltage (i.e., greater than 3 Volts) is applied to control capacitor 202/203 (i.e., control gate 240 and isolated region IPW), the source of n-channel transistor 220 and the drains of p-channel transistor 210 and n-channel transistor 220 are floating, and n-well region 215 is grounded (i.e., maintained at 0 Volts). Under these voltage conditions electron-hole pairs are generated in the source region 212 of p-channel transistor 210. The electrons are accelerated by a lateral electric field toward the channel region 217 of p-channel transistor 210, and some of these electrons attain high energy. These high-energy electrons pass through tunnel (bottom) oxide 219 separating source region 212 and floating gate portion 230-2, and become trapped in floating gate structure 230. During erase operations, N-well region 215 is maintained in the range of 4.5 to 5V, and gate 275 of transistor 270 is also maintained at 5V to close the signal path between p-channel transistor 210 and node A. The voltage applied to N-well region 215 is divided between the reverse biased p+/−n junction of p-channel transistor 270 and the n+/−p junction of n-channel transistor 220, thus radically decreasing gate induced drain leakage (GIDL) in both transistors. A voltage of −4.5 to −5V is applied to control gate 240. Under these conditions, approximately 90% of the control gate voltage is transferred to floating gate 230, thus facilitating erase by Fowler-Nordheim emission from the floating gate 230 into the N-well region 215. During readout, both N-well 215 and deep N-well region DNW are connected to Vcc (e.g. 1.5-1.8V). Gate 275 of transistor 270 is maintained at 0V such that it remains open (i.e., its source and drain change places when the inverter switches). Under these conditions, the read-out operation is similar to that described in U.S. Pat. No. 6,788,578, cited above.

FIG. 5 is a modified schematic diagram showing a portion of an integrated circuit (IC) 200A according to another embodiment of the present invention. Integrated circuit (IC) 200A includes an electrically erasable and programmable CMOS logic memory cell 201A that is similar to CMOS logic cell 201 (described above), but is fabricated without the IPW capacitor (i.e., memory cell 201A omits the isolated P-well region and deep N-well region formed below control gate 240). Floating gate 230 and control gate 240 are formed in the interdigitated pattern described above with reference to FIG. 4, and provide capacitor 203 that functions in the manner described above with reference to FIGS. 4-5. Although cell 201A does not provide a capacitance that is as high as the capacitance of cell 201, this arrangement simplifies the fabrication process and was found to suitably facilitate the Fowler-Nordheim erase operation described above with reference to cell 201. Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A complimentary metal-oxide-silicon (CMOS) integrated circuit (IC) device including a plurality of non-volatile logic cells formed on a substrate, each non-volatile logic cell comprising:
   a polycrystalline silicon floating gate disposed over the substrate;
   a control capacitor including:
   a first capacitor including a first portion of the floating gate and an isolated P-well region formed in the substrate below the first portion of the floating gate;
   a second capacitor including a polycrystalline silicon control gate structure located adjacent to said first portion of the floating gate,
   a non-volatile p-channel transistor including a first source region and a first drain region disposed in an N-well region formed in the substrate adjacent to a second portion of the floating gate;
   wherein the isolated P-well region of the first capacitor is electrically connected to the control gate structure; and
   means for controlling said control capacitor and said non-volatile p-channel transistor such that band-to-band tunneling (BBT) is induced between said floating gate and one of said isolated P-well region and said non-volatile p-channel transistor during a program/erase operation.

2. The CMOS IC device of claim 1, wherein said each non-volatile logic cell further comprises:
   a non-volatile n-channel transistor including a second source region and a second drain region disposed in a P-well region formed in the substrate adjacent to a third section of the floating gate; and
   a select transistor connected to at least one of the first drain and the second drain.

3. The CMOS IC device of claim 2, further comprising a shallow trench isolation layer disposed between the isolated P-well region and the first portion of the floating gate structure, and silicon nitride disposed between the control gate and first portion of the floating gate structure.

4. The CMOS IC device of claim 1, wherein both polycrystalline silicon floating gate and polycrystalline silicon control gate structure comprise structures having multiple fingers extending from associated common bases, and arranged such that said fingers of the control gate structure are interdigitated with said fingers of said floating gate.

5. The CMOS IC device of claim 1, wherein the isolated P-well region is disposed in a deep N-well region diffused into said substrate.

6. A complimentary metal-oxide-silicon (CMOS) integrated circuit (IC) device including a plurality of non-volatile logic cells formed on a substrate, each non-volatile logic cell comprising:
   a polycrystalline silicon floating gate disposed over the substrate;
   a control capacitor including:
   a first capacitor including a first portion of the floating gate and an isolated P-well region formed in the substrate below the first portion of the floating gate;
   a second capacitor including a polycrystalline silicon control gate structure located adjacent to said first portion of the floating gate,
   a non-volatile p-channel transistor including a first source region and a first drain region disposed in an N-well region formed in the substrate adjacent to a second portion of the floating gate; and a non-volatile n-channel transistor including a second source region and a second drain region disposed in a P-well region formed in the substrate adjacent to a third section of the floating gate;

wherein the isolated P-well region of the first capacitor is electrically connected to the control gate structure, and wherein each non-volatile logic cell further comprises a second p-channel transistor connected between the first drain and the second drain, wherein the second p-channel transistor is disposed in the N-well region.

7. The CMOS IC device of claim 6, further comprising means for controlling said first capacitor, said second capacitor, said non-volatile p-channel transistor and said second p-channel transistor such that Fowler-Nordheim injection is induced between said floating gate and one of said isolated P-well region and said non-volatile p-channel transistor during a program/erase operation.

8. A complimentary metal-oxide-silicon (CMOS) integrated circuit (IC) device including a plurality of non-volatile logic cells formed on a substrate, each non-volatile logic cell comprising:

a polycrystalline silicon floating gate disposed over the substrate;

a polycrystalline silicon control gate structure located adjacent to a first portion of the floating gate; and an inverter including:

a non-volatile p-channel transistor including a first source region and a first drain region disposed in an N-well region formed in the substrate adjacent to a second portion of the floating gate, and a non-volatile n-channel transistor including a second source region and a second drain region disposed in a P-well region formed in the substrate adjacent to a third portion of the floating gate, wherein said control gate structure is capacitively coupled to said first portion of the floating gate such that said control gate and said first portion of the floating gate comprise a capacitor.

9. The CMOS IC device of claim 8, wherein the inverter of said each non-volatile logic cell further comprises a select transistor connected to at least one of the first drain and the second drain.

10. The CMOS IC device of claim 8, wherein both polycrystalline silicon floating gate and polycrystalline silicon control gate structure comprise structure having multiple fingers extending from associated common bases, and arranged such that said fingers of the control gate structure interdigitated with said fingers of said floating gate.

11. The CMOS IC device of claim 8, wherein each non-volatile logic cell further comprises a second p-channel transistor connected between the first drain and the second drain, wherein the second p-channel transistor is disposed in the N-well region.

12. The CMOS IC device of claim 11, further comprising means for controlling said control gate, said non-volatile p-channel transistor and said second p-channel transistor such that Fowler-Nordheim injection is induced between said floating gate and said non-volatile p-channel transistor during a program/erase operation.

13. The CMOS IC device of claim 11, further comprising means for controlling said control gate, said isolated P-well region, said non-volatile p-channel transistor and said second p-channel transistor such that Fowler-Nordheim injection is induced between said floating gate and one of said isolated P-well region and said non-volatile p-channel transistor during a program/erase operation.

14. The CMOS IC device of claim 13, wherein the isolated P-well region is disposed in a deep N-well region diffused into said substrate.

15. The CMOS IC device of claim 8, further comprising a tunneling capacitor including said first portion of the floating gate and an isolated P-well region formed in the substrate below the first portion of the floating gate and said control gate.

* * * * *